(12) United States Patent  
Shmayovitsh et al.

(10) Patent No.: US 7,770,142 B1  
(45) Date of Patent: Aug. 3, 2010

(54) MODELING POWER MANAGEMENT FOR AN INTEGRATED CIRCUIT

(75) Inventors: Arik Shmayovitsh, Herzlia (IL); John Decker, Annandale, NJ (US); Dan Leibovich, Modiin (IL)

(73) Assignee: Cadence Design Systems, Inc., San Jose, CA (US)

( * ) Notice: Subject to any disclaimer, the term of this patent is extended or adjusted under 35 U.S.C. 154(b) by 91 days.

(21) Appl. No.: 11/929,517

(22) Filed: Oct. 30, 2007

Related U.S. Application Data

(60) Provisional application No. 60/855,443, filed on Oct. 30, 2006.

(51) Int. Cl.  
*G06F 17/50* (2006.01)

(52) U.S. Cl. .............................. 716/5; 716/4

(58) Field of Classification Search .................. 716/4–6  
See application file for complete search history.

(56) References Cited

U.S. PATENT DOCUMENTS

| | | | |
|---|---|---|---|
| 6,631,502 B2 * | 10/2003 | Buffet et al. | 716/4 |
| 6,779,163 B2 | 8/2004 | Bednar et al. | |
| 6,820,240 B2 | 11/2004 | Bednar et al. | |
| 6,883,152 B2 | 4/2005 | Bednar et al. | |
| 2005/0251771 A1 * | 11/2005 | Robles | 716/5 |
| 2007/0245285 A1 * | 10/2007 | Wang et al. | 716/10 |
| 2008/0071513 A1 * | 3/2008 | Chickermane et al. | 703/15 |

\* cited by examiner

*Primary Examiner*—Jack Chiang  
*Assistant Examiner*—Binh C Tat  
(74) *Attorney, Agent, or Firm*—Schwegman, Lundberg & Woessner, P.A.

(57) ABSTRACT

A method for modeling power management in an integrated circuit (IC) includes: specifying a circuit design and a power architecture for the IC, the power architecture including a plurality of power domains for specifying power levels in different portions of the IC; determining a testbench for simulating the IC and a verification plan for evaluating simulation results; using the testbench to simulate variations in power levels of the power domains of the IC; and using the verification plan to evaluate the simulation results for the power domains of the IC.

25 Claims, 16 Drawing Sheets

| Item | Description | Verification Usage |
|---|---|---|
| Power Domain | Basic building block for power architecture. Defines a set of instances that share a common power architecture | System power modes are defined with respect to the state or voltage level of its power domains.<br><br>Coverage information is organized on a per power domain basis |
| Power mode | The power mode defines a set of valid states for a design or block. It is defined by specifying the nominal condition (voltage level) of each of the designs or blocks power domains | Coverage of system power modes is based on this definition<br><br>Checking of illegal modes |
| Nominal_condition | The operating condition at a particular voltage. It provides a compact, readable way to express the voltage level of a domain | Used to define power modes |
| Power Mode Transition | A power mode transition defines a switch from one power mode to another. It typically includes a "-start_condition" that defines how this transition is initiated | Coverage of power mode transitions is based on this definition<br><br>Coverage provided for all "-start_conditions" found in CPF |

| Item | Description | Verification Usage |
|---|---|---|
| Shutoff_condition | The shutoff condition defines when the power is turned on/off to a particular power domain | Used to determine the current power mode of the design<br><br>Coverage is generated to ensure the simulation toggled this control signal |
| Isolation_condition | Power domains boundaries need to be isolated to ensure values from a shutoff region do not affect the rest of the design. The shutoff region produces "x's" or unknowns for simulation, having this go across a boundary causes design failures<br><br>The isolation definition defines the signals to be isolated, and a control signal to turn on the isolation | Coverage is generated for each isolation control condition |
| Save_edge | Before a power domain turns off, the user may wish to save some of its state, this ensures the design powers up in a good state. This saving is controlled by the save_edge. | Coverage is provided for this save_edge |
| Restore_edge | After the power is turned on, the design needs to restore the previously saved state. The restore_edge is used to trigger the state restoration. | Coverage is provided for all relevant restore edges. |

| Item | Related CPF commands |
|---|---|
| Power Domain | Create_power_domain |
| Power mode | Create_power_mode |
| Nominal_condition | Set_nominal_condition |
| Power Mode Transition | Create_mode_transition |
| Shutoff_condition | Create_power_domain-shutoff_expression |
| Isolation_condition | Create_isolation_rule-isolation_condition |
| Save_edge | Create_state_retention_rule-save_edge |
| Restore_edge | Create_state_retention_rule-restore_edge |

FIG. 8

Bucket Analysis [0]

File  Edit  View  Analysis  Options

Prev  Next | Export  Buckets  Holes  Project | Lock  Close

Buckets of Item:
power_modes_s.power_mode_changed.transition__power_mode

At least : 1

Buckets Table

| prev_power_mode | power_mode | Count | Tests |
|---|---|---|---|
| PM1 | PM2 | 7 | 1 |
| PM2 | PM3 | 7 | 1 |
| PM3 | PM4 | 7 | 1 |
| PM4 | PM1 | 0 | 0 |
| PM4 | PM3 | 7 | 1 |

| Session | Run | Total Simtime | pm01 | Perc | pm02 | Perc | pm03 | Perc |
|---|---|---|---|---|---|---|---|---|
| power_dma_mac | simple_test | 66600 | 11100 | 16 | 22200 | 33 | 33300 | 50 |
| power_dma_mac | test2 | 66000 | 11000 | 16 | 22000 | 33 | 33000 | 50 |
| power_dma_mac | test3 | 60000 | 10000 | 16 | 20000 | 33 | 30000 | 50 |
| power_dma_mac | subtotal | 192600 | 32100 | 16 | 64200 | 33 | 96300 | 50 |
| dma_mac | simple_test | 180000 | 50000 | 27 | 60000 | 33 | 70000 | 38 |
| dma_mac | test2 | 198000 | 55000 | 27 | 66000 | 33 | 77000 | 38 |
| dma_mac | test3 | 199800 | 55500 | 27 | 66600 | 33 | 77700 | 38 |
| dma_mac | subtotal | 577800 | 160500 | 27 | 192600 | 33 | 224700 | 38 |
| final | total | 770400 | 192600 | 25 | 256800 | 33 | 321000 | 41 |

HTML File     Ready

|     | Domain1 | Domain2 |
| --- | --- | --- |
| PM1 | HIGH | off |
| PM2 | off | off |
| PM3 | HIGH | LOW |
| PM4 | LOW | HIGH |

LOW = 0.7V     HIGH = 1.1V

*FIG. 14*

MODELING POWER MANAGEMENT FOR AN INTEGRATED CIRCUIT

CROSS-REFERENCE TO RELATED APPLICATIONS

This application claims the benefit of U.S. Provisional Application No. 60/855,443, filed Oct. 30, 2006, entitled METHOD AND APPARATUS FOR DEVELOPING TEST BENCH FOR LOW-POWER DESIGN, and incorporated herein by reference in its entirety.

This application is related to commonly owned U.S. Provisional Application No. 60/792,060, filed Apr. 14, 2006, and entitled METHOD AND MECHANISM FOR IMPLEMENTING ELECTRONIC DESIGNS HAVING POWER INFORMATION SPECIFICATIONS, U.S. Ser. No. 11/489,384, filed Jul. 18, 2006, and entitled METHOD AND SYSTEM FOR SIMULATING STATE RETENTION OF AN RTL DESIGN, and U.S. Ser. No. 11/489,385, filed Jul. 18, 2006, and entitled SIMULATION OF POWER DOMAIN ISOLATION, each of which is expressly incorporated herein by reference in its entirety.

BACKGROUND OF THE INVENTION

1. Field of Invention

The present invention relates to integrated circuits and more particularly to power-management design of integrated circuits.

2. Description of Related Art

With the rapid growth of wireless and portable consumer electronic devices, there have been increasing demands for new technological advancements with more and more functionalities being crammed into battery-operated devices. This phenomenon has resulted in substantial design and verification challenges for low-power applications, and as a result designers are increasingly turning towards advanced verification methodologies, such as coverage driven verification, and verification planning. (See, for example, "Getting Back to Basics with Planning, Metrics, and Management", Hamilton Carter, EDA Design Line (www.edadesignline.com), Jul. 13, 2007; and "Verification Planning to Functional Closure of Processor-Based SoCs", Andrew Piziali, DesignCon 2006 (www.designcon.com), Santa Clara, Calif., Feb. 6-9, 2006.)

The challenges include minimizing leakage power dissipation, designing efficient packaging and cooling systems for high-power integrated circuits, verifying functionalities of low-power or no power situations early in the design. Such power management issues become even more critical in view of the continuous shrinking of device dimensions with the next generation of semiconductor processing technology. Addressing such power management issues is critical in the integrated circuit design flow for portable consumer electronic devices.

Existing power optimization and implementation techniques are typically applied at the physical implementation phase of the design process. Certain power management techniques can only be implemented at the physical level after circuit synthesis. These power management design techniques may significantly change the design intent, yet none of the intended behavior can be captured in the RTL of the design. This deficiency creates a gap in the RTL to Graphic Data System II (GDSII) implementation and verification flow where the original RTL can no longer be relied upon as a correct representation of the design, and thus cannot be used to verify the final netlist implementation containing power management implementations.

Therefore, there is a need for incorporating power information of the circuit to address the deficiencies of the existing design methodologies early on in the design process. Specifically, there is a need for incorporating power information in the early design cycles and applying the power information to the entire design flow of verification, validation, synthesis, test, physical synthesis, routing, analysis and signoff tool. In particular, there is a need to ensure that other portions of the integrated circuit are functional when one or more power domains are powered down in an RTL design environment.

SUMMARY OF THE INVENTION

In one embodiment of the present invention, a method for modeling power management in an integrated circuit (IC) includes: specifying a circuit design and a power architecture for the IC, the power architecture including multiple power domains for specifying power levels in different portions of the IC; determining a testbench for simulating the IC and a verification plan for evaluating simulation results; using the testbench to monitor variations in power levels of the power domains of the IC; and using the verification plan to evaluate the simulation results for the power domains of the IC.

According to one aspect of this embodiment, the power architecture may include multiple power modes that specify power levels in each power domain. Additionally, with respect to this aspect, at least one power domain may include multiple sub-domains (e.g., arranged in a hierarchy) so that each power mode includes a specification of distinct power levels for the power sub-domains. Additionally, with respect to this aspect, the power modes may include multiple power modes, for example, a high-power level, a low-power level, and a power-off level (e.g., measured in volts).

According to another aspect, the power architecture may include at least one control signal for each power domain, where the at least one control signal includes a signal for enabling a power switch, enabling an isolation cell, or enabling a state retention (e.g., with corresponding state restoration).

According to another aspect, determining the testbench may include determining coverage items for monitoring the power domains (e.g., by counting instances of power-domain events).

According to another aspect, determining the testbench may include determining coverage items for monitoring states of power-related control signals (e.g., for isolation, state retention or power shutoff). These may be used, for example, to determine correct operation of power sequencing in a domain during power-on or power-off operations.

According to another aspect, determining the testbench may include determining attributes for grouping common features of power-related failures (e.g., power modes and power-mode transitions at failure).

According to another aspect, determining the verification plan may include determining a template for evaluating at least one coverage criterion for completeness of the simulation results across the power domains.

According to another aspect, using the testbench may include monitoring power modes that specify power levels in the power domains.

According to another aspect, using the verification plan may include providing a graphical user interface (GUI) that shows coverage levels for power levels of the power domains. Similarly the GUI may show coverage levels for control signals.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer. In these ways the present invention enables incorporating power information into the design of integrated circuits.

BRIEF DESCRIPTION OF THE DRAWINGS

FIG. 6 shows further details for items related to the overall power architecture in the embodiment of FIG. 1.

FIG. 7 shows further details for items related to the distinct power domains in the embodiment of FIG. 1.

FIG. 8 shows further details for a common power format (CPF) that characterizes items shown in FIGS. 6 and 7.

FIG. 11 shows show exemplary GUI representation for evaluating the coverage items post-simulation in the embodiment of FIG. 1.

FIG. 13 shows show exemplary GUI representation for evaluating the coverage items post-simulation in the embodiment of FIG. 1.

FIG. 14 shows an embodiment related to the embodiment of FIG. 1 where the power domains take on more than two voltage values.

DETAILED DESCRIPTION OF EXEMPLARY EMBODIMENTS

Figure 1:
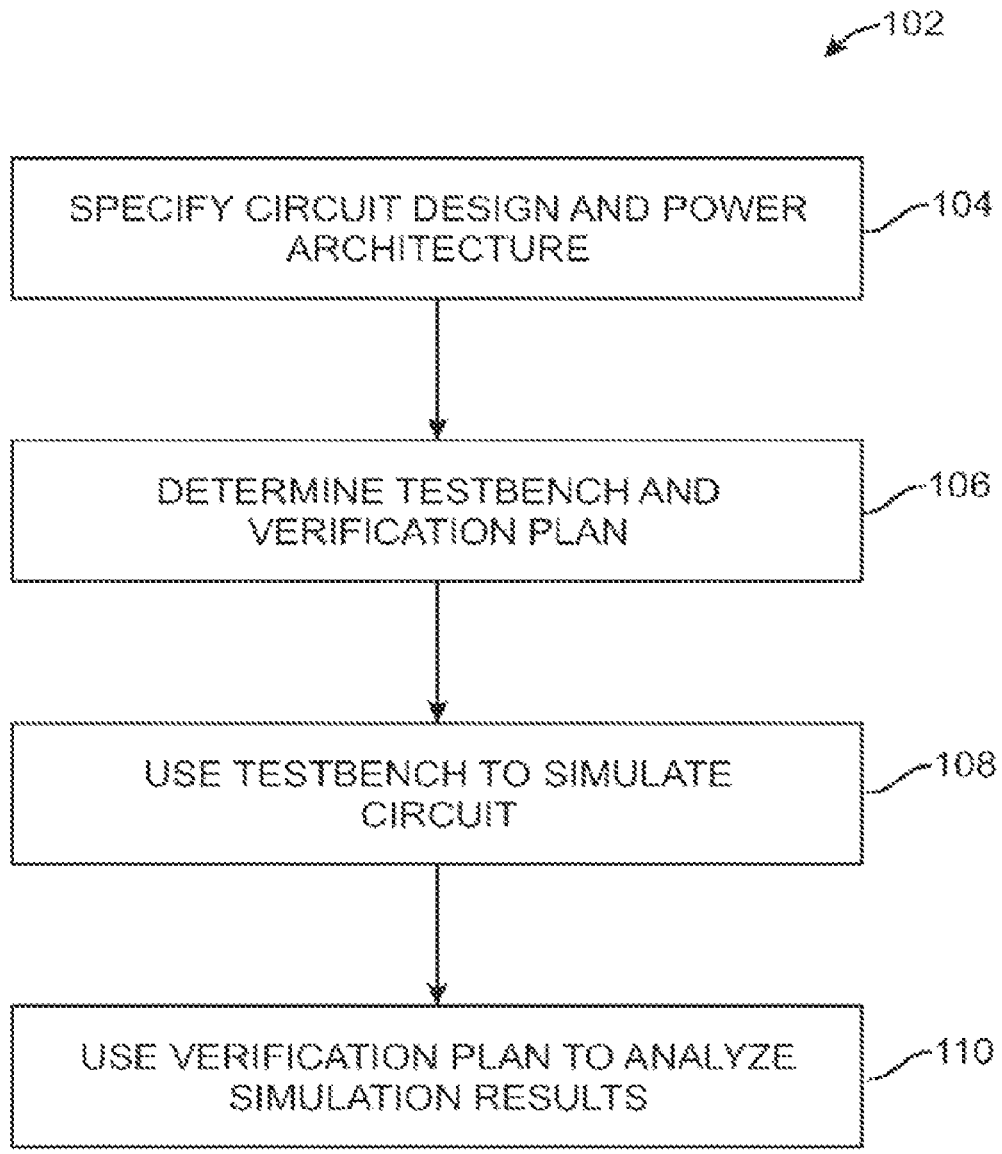
FIG. 1 shows a method for modeling power management in an integrated circuit (IC) according to an embodiment of the present invention.

An embodiment of the present invention is shown in FIG. 1. A method 102 for modeling power management in an integrated circuit (IC) includes: specifying a circuit design and a power architecture for the IC 104, where the power architecture includes multiple power domains for specifying power levels in different portions of the IC; determining a testbench for simulating the IC and a verification plan for evaluating simulation results 106; using the testbench to simulate variations in power levels of the power domains of the IC 108; and using the verification plan to evaluate the simulation results for the power domains of the IC 110. Additional exemplary details for each step are provided below.

Figure 2:
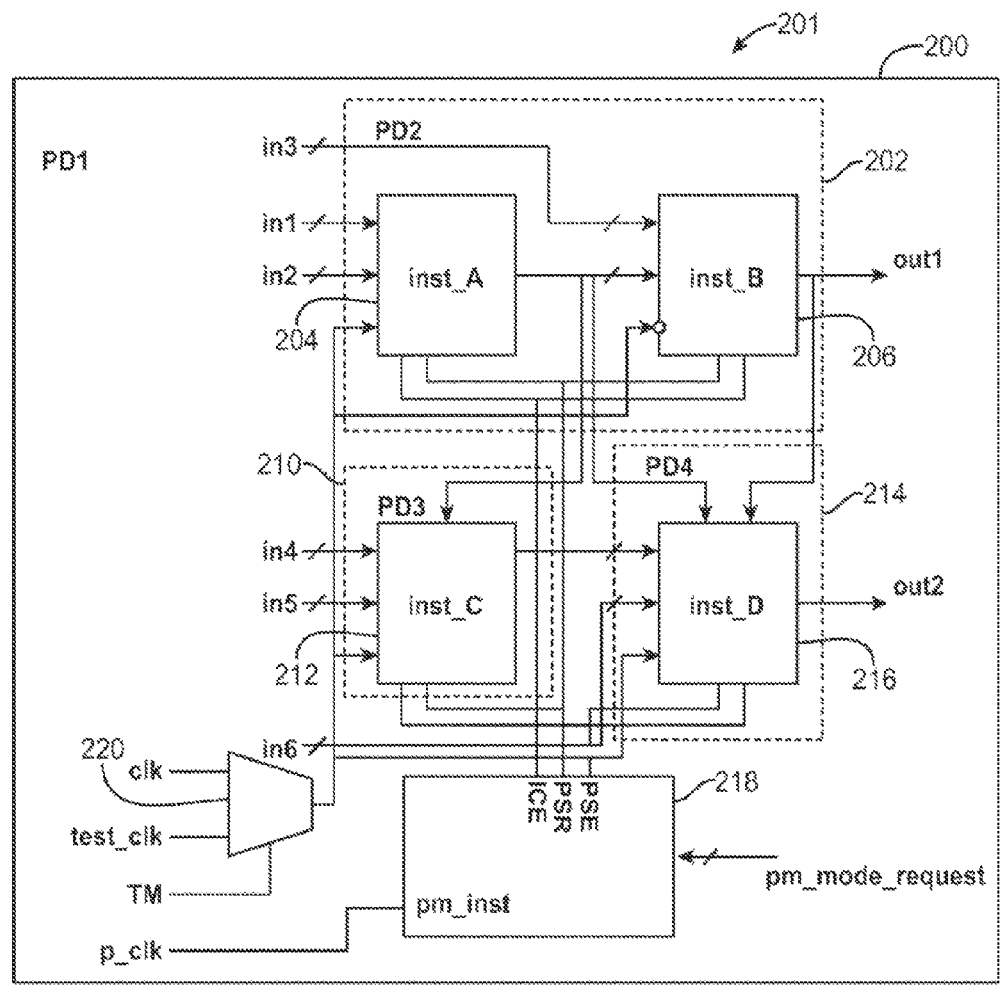
FIG. 2 shows an exemplary IC with power domains for the embodiment of FIG. 1.
Figure 3:
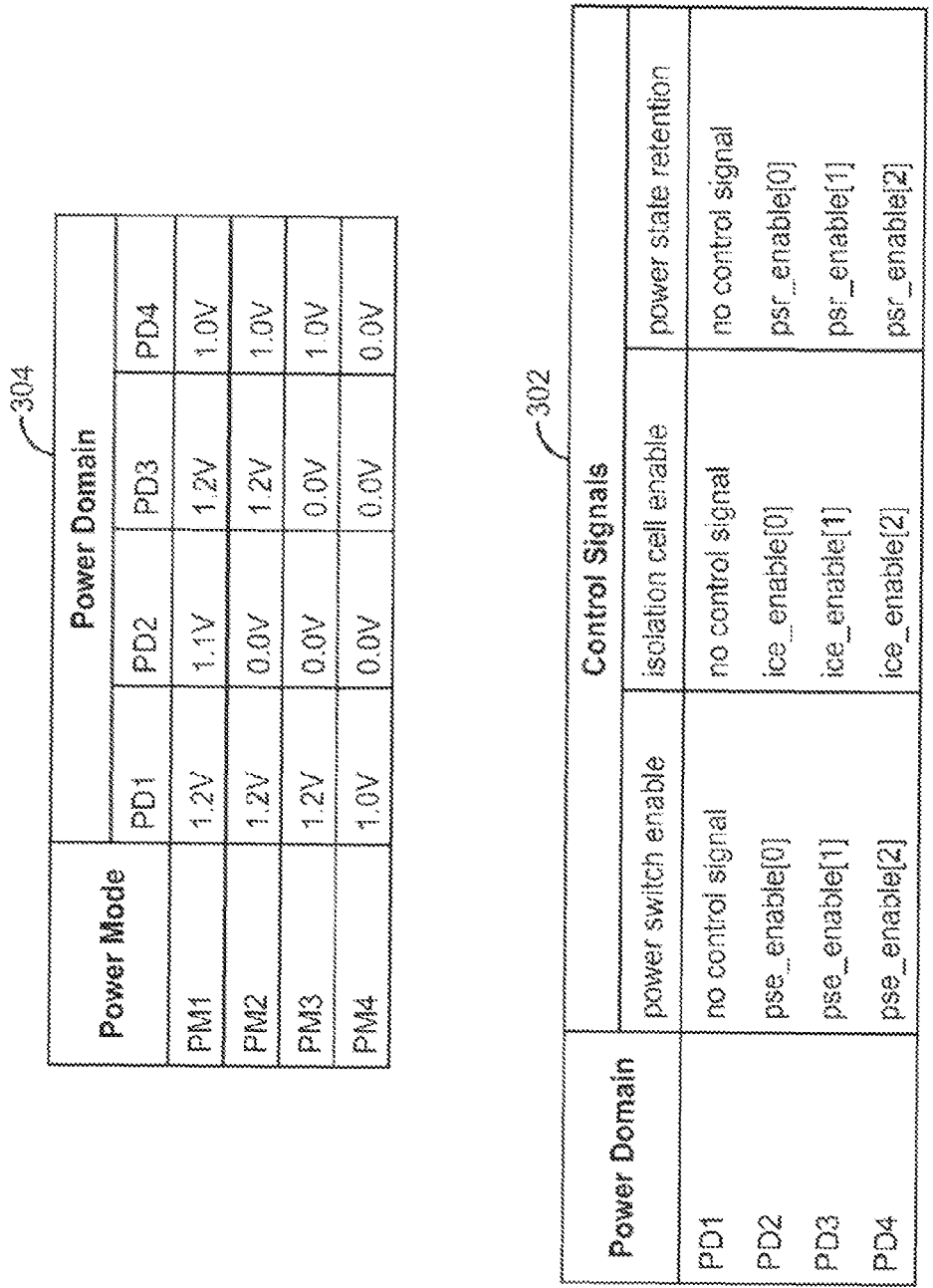
FIG. 3 shows further details for the power architecture of the IC of FIG. 2.
Figure 4:
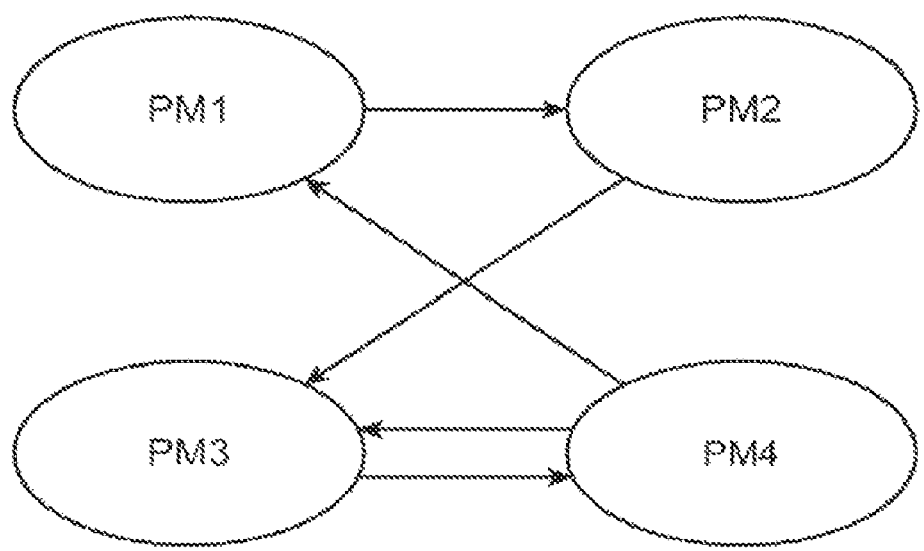
FIG. 4 shows further details for the power architecture of the IC of FIG. 2.

FIGS. 2-4 show details related to specifying a circuit design and power architecture for the IC 104. FIG. 2 shows an exemplary IC 201 with power domains PD1 200, PD2 202, PD3 210, and PD4 214, where PD1 is a system-level power domain that includes PD2, PD3, and PD4 and additional system elements 218, 220. Power domain PD2 includes two instances (e.g., design elements) 204, 206. Power domain PD3 includes one instance 212, and power domain PD4 includes one instance 216. A clock mux 220 switches between a nominal clock and a test clock. Power control is carried out by a power control module 218 that is controlled by an external mode-request signal.

FIG. 3 shows further details related to the power architecture of the IC of FIG. 2. For each power domain control signals 302 are shown including power switch enable, isolation cell enable, and power state retention (corresponding respectfully to pse, ice and psr in the control module 218). Four power modes 304 are shown with designated voltage levels for the four power domains. FIG. 4 shows a related state transition diagram that includes allowed state transitions. For example, PM1→PM2 is allowed, but PM2→PM1 is not allowed.

In this simplified exemplary IC design 201, the power domains PD2, PD3, and PD4 all have separate power control and can be powered on or off independently of each other. In a more complex and realistic system, this design could be developed to represent a cellular telephone, where PD2 could be a communication port for connecting the phone to another computer, PD3 could be a graphics processor used for displaying video, and PD4 could be an audio processor. The definition of the power modes might be based on power management for standard operational modes and scenarios. For example, when the cell phone is not ringing, the audio processor can be turned off to save power. Similarly, the communication port only has to be turned on when the phone is connected to a computer. Definitions for the power modes could follow from these considerations as, for example, where PM1 corresponds to when the cell phone is on and connected to a computer, PM2 corresponds to when the cell phone is on and the user is talking, PM3 corresponds to when the phone is ringing, and PM4 corresponds to when the phone is idle.

Figure 5:
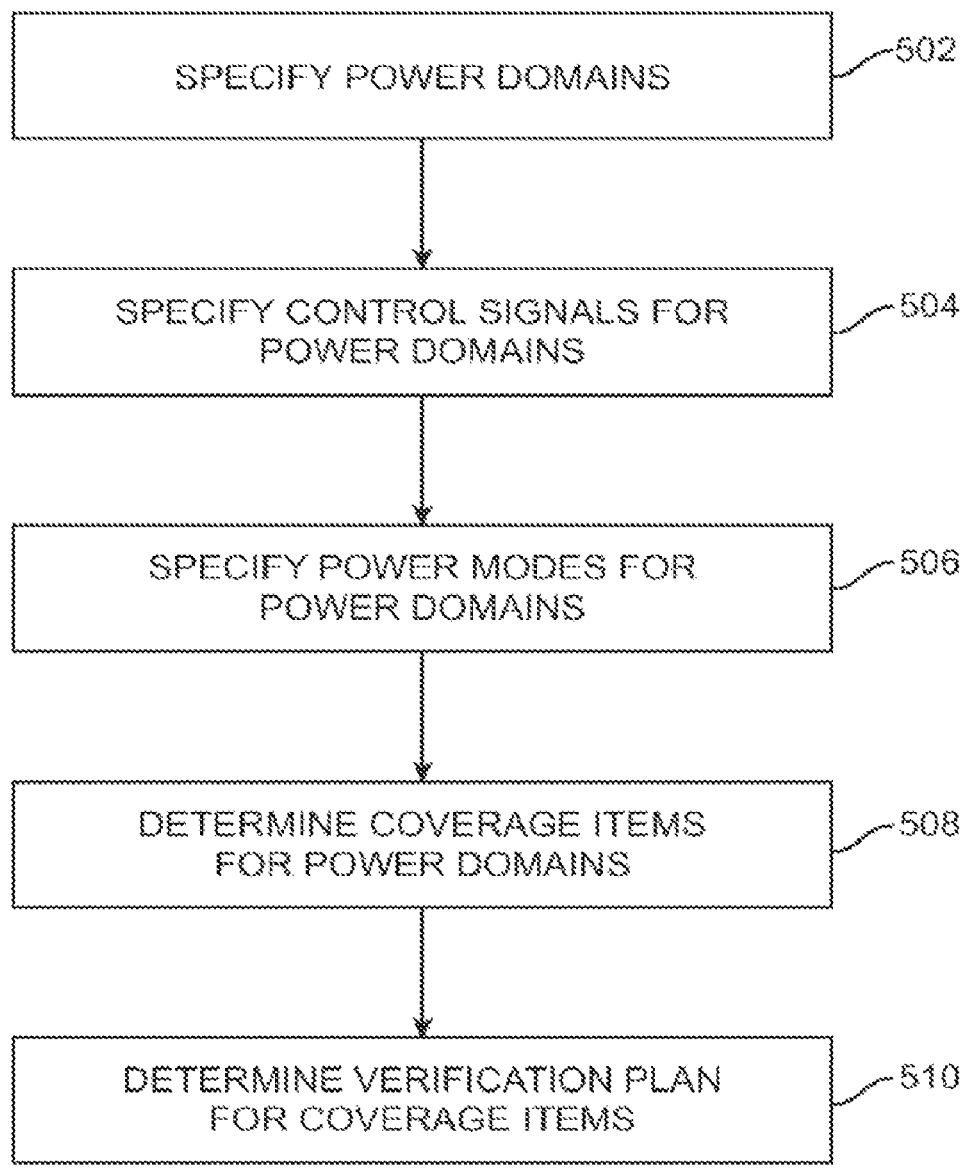
FIG. 5 shows additional details for determining the testbench and verification plan in the embodiment of FIG. 1.

FIG. 5 shows further details related to determining a testbench for simulating the IC and a verification plan for evaluating simulation results 106. This process includes: specifying power domains 502 (e.g., as in FIG. 2), specifying control signals for the power domains 504 (e.g., as in FIG. 3) specifying power modes for the power domains 506 (e.g., as in FIGS. 3-4), determining coverage items for monitoring states of power domains by counting instances of power domain states 508, and determining a verification plan for the coverage items 510, where this plan may include a template for evaluating at least one coverage criterion for completeness of the simulation results across the power domains.

Determining the coverage items 508 relates generally to characterizing the power architecture by coverage items that can be monitored to verify power management design, and the corresponding verification plan 510 relates generally to the evaluation of the simulated results for these items. FIGS. 6-8 show exemplary coverage items related to the power architecture and their relevance for verifying the power management design by means of a common power format (CPF) for characterizing the power architecture. As discussed below, determining a verification plan may include a template for evaluating at least one coverage criterion for completeness of the simulation results across the power domains. For this embodiment, the goal of the generated testbench is to ensure that the resulting simulation suite exercises all the relevant control signals and power modes. Coverage is collected on each of these items to count how often each of these modes and controls were changed.

FIG. 6 shows details for items related to the overall power architecture including power domains, power modes, nominal conditions, and power mode transitions. The power domain is the basic building block for the power architecture. Collectively the power domains define a set of instances that share the common power architecture. System power modes are defined with respect to the state or voltage level of its power domains, and coverage information is organized on a per power domain basis. The power mode defines a set of valid states for a design or block. It is defined by specifying the nominal condition (voltage level) of each of the designs or blocks power domains. Coverage of system power modes is based on this definition as is checking for illegal modes (e.g., not included in the power modes defined in FIG. 3). The nominal condition denotes the operating condition at a particular voltage. It provides a compact, readable way to express the voltage level of a domain and is used to define power modes (e.g., on, off, high, low). A power mode transition defines a switch from one power mode to another. It typically includes a "-start_condition" that defines how this transition is initiated. Coverage of power mode transitions enables monitoring of legal and illegal transitions (e.g., illegal state transitions in FIG. 4).

FIG. 7 shows details for items corresponding to distinct power domains in the power architecture including shutoff conditions, isolation conditions, saving edges and restoring edges. The shutoff condition defines when the power is turned on/off to a particular power domain. This item is used in the determination of the current power mode of the design, and coverage is generated to ensure the simulation has toggled this control signal. The isolation condition defines the signals to be isolated and corresponding control signal to turn on the isolation. In general, power domain boundaries need to be isolated to ensure values from a shutoff region do not affect the rest of the design. Typically, the shutoff region produces "x's" or unknowns for simulation and sending these values across a boundary can causes a design failure. As a result, coverage is typically generated for each isolation control condition. Saving the state of critical sequential elements of a domain is often desirable before a power domain is turned off in order to ensure the design powers up in a good (e.g., legal) state. This saving is controlled by the save_edge item. Coverage is typically generated for each save_edge item. Restoring a state (or edge value) is often necessary after the power is turned on. The restore_edge is used to trigger the state restoration, and coverage is typically provided for all relevant restore edges.

FIG. 8 shows nominal commands for a CPF that characterizes the items shown in FIGS. 6-7 including power domains, power modes, nominal conditions, power mode transitions, shutoff conditions, isolation conditions, saving edges and restoring edges. Establishing a CPF that captures relevant features of the power architecture enables embodiments of the invention (e.g., a software testbench) to monitor the related power states (e.g., power modes and transitions between power modes).

Table A contains an exemplary CPF file that can be considered for illustrating testbench determination including generating simulation code for tracking values related to the power states and the control signals.

With respect to the power states, simulation code is generated for tracking the power mode of the design, understanding the transitions, and flagging any errors related to illegal modes and transitions. First the power mode state definitions 304 are extracted, for example, by using the create_power_mode commands in the CPF file. Those skilled in the art of computer programming will recognize the applicability of the following simple example with reference to Table A. On line 18 (of Table A) a power mode is defined by create_power_mode -name PM1
-domain conditions {PD1@high PD2@medium PD3@high PD4@low} where the definitions for low, medium, and high are further specified at lines 15-17:

create_nominal_condition -name high -voltage 1.2
create_nominal_condition -name medium -voltage 1.1
create_nominal_condition -name low -voltage 1.0

Code could be generated (e.g., C, C++, etc.) in the following form to define the power modes:

if (PD1=1.2V and PD2=1.1V and PD3=1.2V and PD4=1.0 v)
then power mode="PM1"

Other aspects of code generation can be similarly developed. For example, mode transitions can be determined by monitoring voltage levels from the simulation tool or monitoring state transitions as defined by the CPF. The mode transitions are defined in the CPF essentially as a state machine (e.g., as in FIG. 4). As an example line 25 (of Table A) defines a mode transition as:

Create_mode_transition -from_mode PM1 -to_mode PM2 -start C1

And from this the following simulation code could be generated:

If (current_mode=PM1 && C1) then next_mode=PM2

With respect to the control signals, simulation code is generated for coverage of the control signals defined in the CPF file. For this example these control signals include the shutoff condition, isolation condition, start conditions, save conditions and restore conditions as defined in the CPF file (e.g., respectively by the commands create_power_mode, create_isolation_rule, create_mode_transitions, and create_state_retention_rule).

As an example, an isolation condition for ice_enable[0] is specified at line 45 (of Table A) as:

create_isolation_rule -name irl -from PD2 \
-isolation_condition {pm_inst.ice_enable[0]}-isolation_output high And this translates into the C++ code found in Table B. Note the struct command at line 1 (of Table B) provides a general data structure of the control coverage.

The verification plan (or vplan) is generated such that it organizes all of the coverage items by the power domain(s) they affect. The code in Table C is an example how a coverage item is referenced in the verification plan. The code in Table C has been generated in the ".vplan" format that is used by some verification management tools. This code fragment refers to a specific instance of the "control_condition" structure that is defined in Table B. The "control_condition==PD2_isolation_logic_irl_isolate" portion of the code specifies that the tool should look up the coverage for the "PD2_isolation_logic_irl_isolate" instance of the "control_condition" structure.

Other control conditions would have similar references in the verification plan (e.g., similar to the code in Table C). The "section" portion of the code defines a hierarchy that shows up in the GUI display 1008 shown in FIG. 10. Each power domain will have a similar section with all the power control signals related to that power domain. The relationship of control signals to power domains is typically done by explicit references in the create_isolation_rule and create_state_retention_rule. For example, the isolation rule above defines "-from PD2", so the isolation signal is associated with PD2. In other cases, these rules will specify the specific pins or instances they affect. The domain that these pins or instances belong to is then determined by comparing the names of these items to the instances that belong to specific power domains. The create_power_domain command defines which instances belong to which power domain (e.g., line 6 of the Table A: "create_power_domain -name PD2-instances {inst_A inst_B}").

Figure 9:
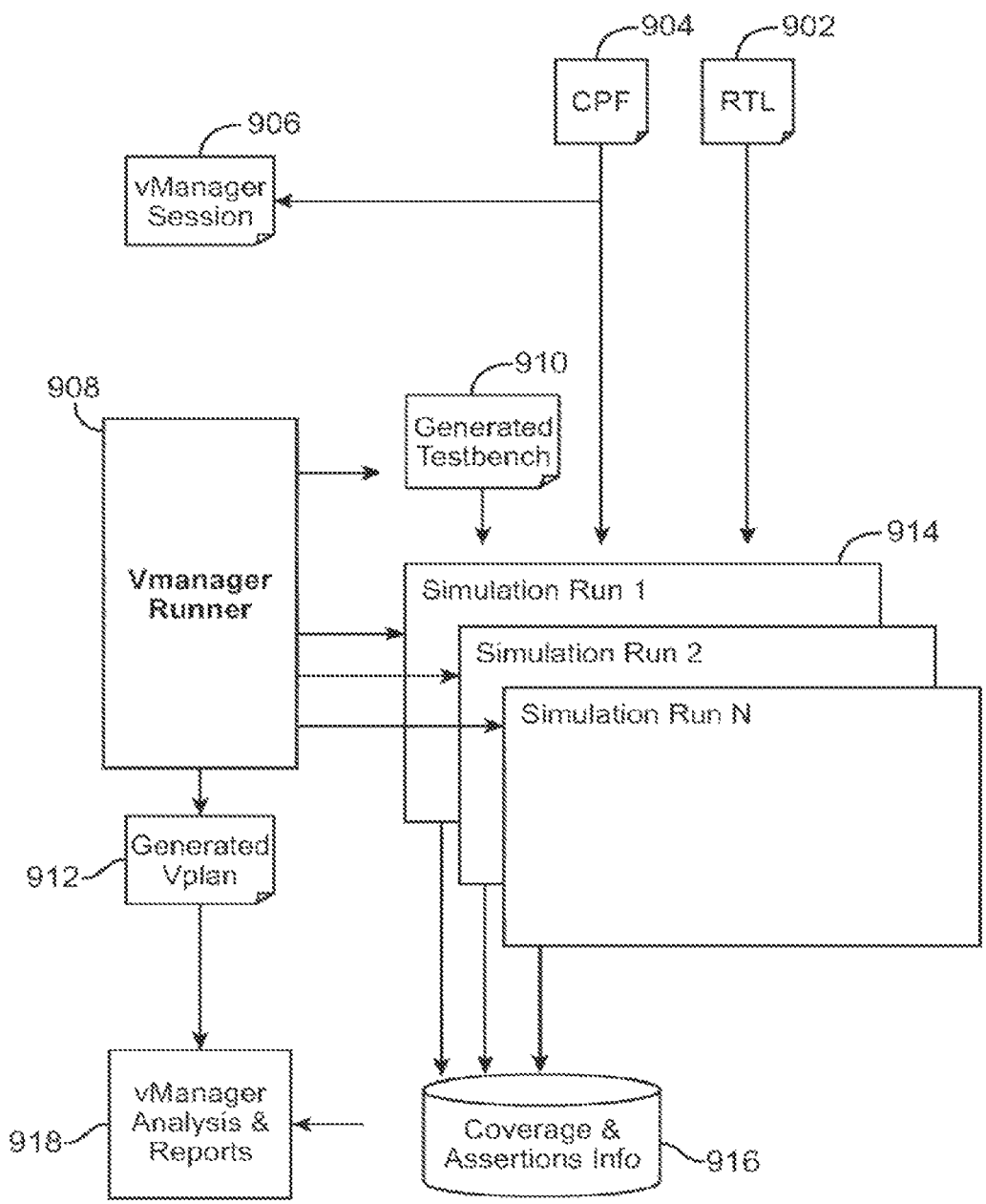
FIG. 9 shows an exemplary sequence that is coordinated through a verification process management tool to carry out operations related to the testbench in the embodiment of FIG. 1

Using the testbench 108 generally includes simulating the IC design to collect data related to the coverage items, for example, by generating simulation inputs for a range of power levels that is specified by the power architecture. FIG. 9 shows an exemplary sequence that is coordinated through a verification process management tool ("Vmanager") 906 to carry out multiple simulations for subsequent analysis. In general, this ability to look across multiple runs is desirable for understanding the overall coverage of the power features.

First a user specifies an IC design by means of an RTL file 902 and a power architecture by means of a CPF file 904. Next a user updates the verification manager 906 to include relevant the power architecture file 904 in the simulation and evaluations. Next the verification manager is called 908 and generates a testbench file 910 and a verification plan file 912. Next the verification manager 908 carries out one or more simulations 914 (e.g., by generating related stimuli for a simulator using conventional methods). Simulation results, which may include assertion information as well as coverage information, are stored in a database 916. Finally the verification manager uses the verification plan 912 and the simulation results 916 to analyze the power management of the design and present related results to the user.

Using the testbench 108 generally results in three functional enhancements to the simulation process 914: (1) determining the power mode, (2) determining coverage, and (3) carrying out checking and debugging.

First, the testbench determines the power mode. In relatively simple cases, the power modes can be determined simply from the power mode definitions in the CPF file (e.g., as in FIG. 8). For simple power shutoff designs, the mode can be computed by analyzing the power shutoff_expression defined for each domain, and translating that to a specific power mode. In this case, the mode is simply defined by specifying which domains are on/off for this mode.

In more complex cases (e.g., where each power domain can take on multiple voltage levels such as high, low and off voltages), the power mode is typically determined in one of two ways. In the first approach, the CPF file may define additional control signals that select the voltage level for the domain. The power mode is calculated based on these control signals in addition to the shutoff_expression. In the second approach, the power mode is determined by using the create_mode_transition command to capture mode transitions (e.g., as in FIG. 4). In these cases, the system will be initialized to the default mode defined in the CPF file. The testbench will monitor all of the "-start_conditions" for the mode transitions, and if it receives one, will calculate the new mode based on the defined mode transitions. This method is more complicated, but allows the user to incorporate more advanced power techniques such as domains that have more than one active voltage level.

Secondly, the testbench determines coverage by maintaining coverage items (or buckets) for counting instances of related power states and state transitions plus control signals and control-signal transitions. These may include, for example, power mode, power domain shutoff, state retention, and isolation condition.

For power mode there is a coverage item with bucket for each power mode defined in the CPF. On each change in shutoff expressions or control signals, the current power mode will be computed and sampled. Coverage of modes transition will also be collected, where the valid space of mode transitions is defined by the mode transitions from the CPF file (e.g., as in FIG. 4).

For power domain shutoff each power domain will have matching item with two buckets: On and Off. Change of the domain's shutoff expression will trigger sampling. Transition coverage will be collected as well within the valid space {e.g., (TRUE→FALSE), (FALSE→TRUE)}.

For state retention each state retention will have a coverage item (boolean) for the restore edge and for the save edge (if defined). The items will be sampled on a change of the matching expression. Transition coverage will be collected as well within the valid space {e.g., (TRUE→FALSE), (FALSE→TRUE)}.

For isolation condition each isolation logic will have a coverage item (boolean). The item will be sampled on a change of the matching expression. Transition coverage will be collected as well within the valid space {e.g., (TRUE→FALSE), (FALSE→TRUE)}.

Third, the testbench carries out checking (e.g., error checking) and debugging by monitoring the coverage items and displaying messages as required. In general, checking for errors is directed towards failure conditions that may included failed assertions, illegal states, and illegal state transitions.

Checking can be enabled or disabled in the generated testbench, with a "power_mode_checking" parameter. Undefined power modes can be detected since the power mode is computed according to the states of the power domains. When the current state of the power domains does not match any defined mode, then the current state is an undefined mode. An undefined mode will be flagged as illegal if the power_mode_checking option was set. (Note that "e" coverage features can be used to report the error.) Illegal mode transitions can be detected during the tracking of the power modes. In general, an illegal transition is any case where a mode changes, but that mode transition was not defined with a "create_mode_transition" in the CPF file. If the power_mode_checking option was set, then an undefined transitions error will be issued if such a transition occurs during the simulation.

Debug messages can be provided by specifying message verbosity options. Typically the verbosity specifies how detailed the messages generated during simulation should be. In an exemplary testbench, a verbosity of "FULL" will output a message on the change of any control condition (shutoff, save/restore edge, isolation, start_condition). The default verbosity reports when a power mode changes, the time of the change, and the old and new modes.

Verification management includes the ability to analyze verification failures by grouping common features of power-related failures (e.g., as attributes of the failure). In the context of low power, these common features may include the current power mode at the time of failure, the last power mode transition before the failure, the simulation time between a power event and a failure. For instance, if a group of failures occurred within 100 nanoseconds of a transition from MODE1 to MODE2, the user can use the verification management features to select the smallest simulation with the same failure to begin the debug process. This may greatly improve a user's productivity by finding the shortest method to debug the problem.

Using the verification plan (or vplan) 110 generally includes providing a graphical user interface (GUI) that shows coverage levels for power levels of the power domains. Typically the generated vplan includes two sections, one for power modes and one for power domains. The power mode section may include information on modes and mode transitions. The power domain section may include power domain coverage items (e.g., shutoff conditions), state retentions subsections defined for that domain, where each subsection includes coverage items for state retention (e.g., save/restore edge), and isolation conditions subsections defined for that domain, where each subsection includes coverage item of the matching condition. Additional sections or subsections can be added. For example, if some control conditions were defined but not matched to any power domain they can appear under a section named "control_signals".

FIGS. 10-13 show exemplary GUI representations for evaluating the coverage items post-simulation.

Figure 10:
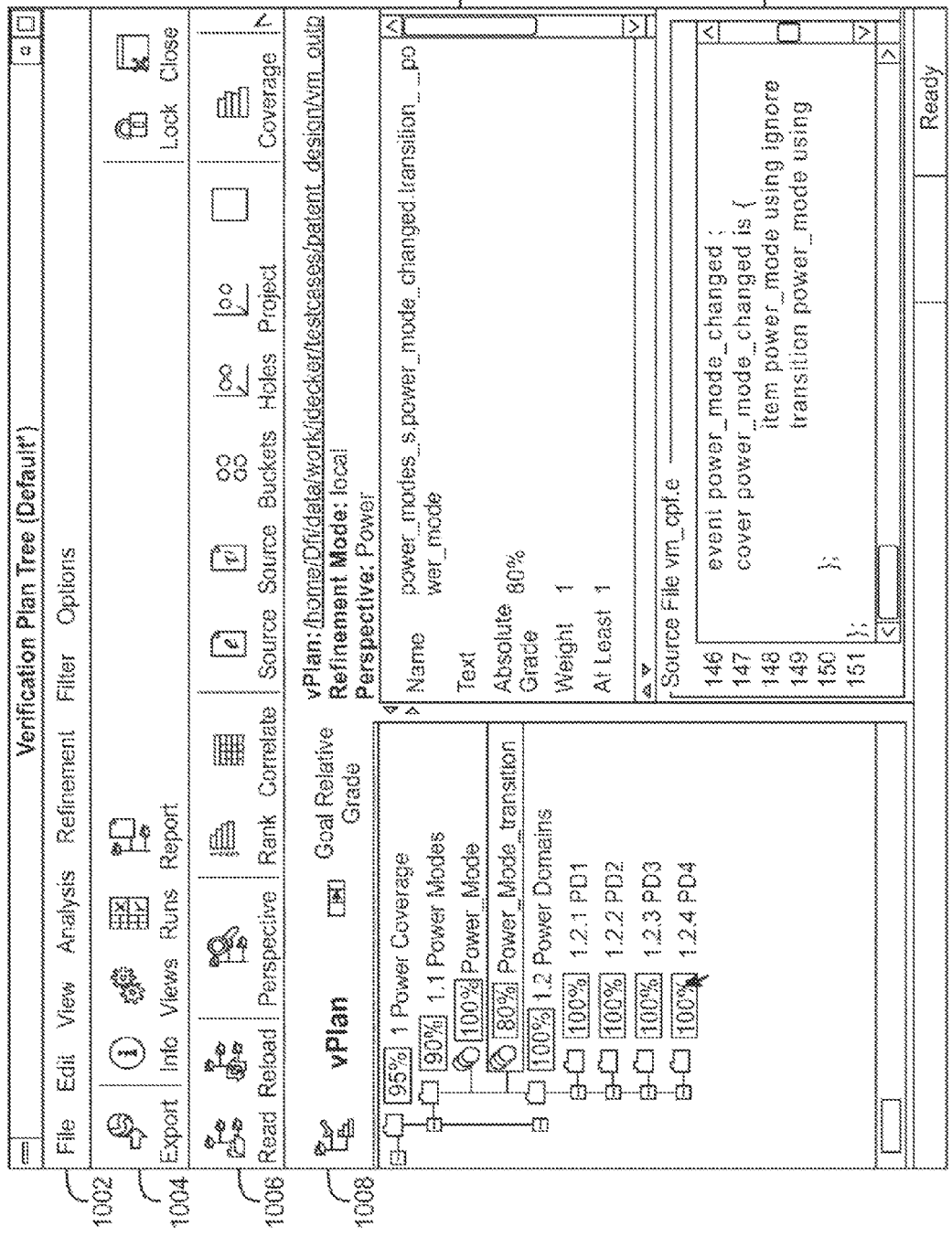
FIG. 10 shows show exemplary GUI representation for evaluating the coverage items post-simulation in the embodiment of FIG. 1.

FIG. 10 shows a verification plan view of the collected coverage information. The top row of selections 1002 includes File, Edit, View, Analysis, Refinement, Filter, and Options. Many of these are standard GUI selection items. Filter can be used to prune the report to show only items with a specific property (e.g., coverage <50%). The next row of selections 1004 includes Export, Info, Views, Runs, and Reports. Export can be used to export the current view to HTML. The other selections can be used to provide different views of the data (e.g., in a report form). The next row of selections 1006 includes Read, Reload, Perspective, Rank, Correlate, Source(e), Source(v), Buckets, Holes, Project, External, and Coverage. Read can be used to read in a new verification plan or reload an existing one. Perspective can be used to provide a different view of the data. Rank can be used to rank simulation runs according to their contributions to overall coverage. Correlate can be used for statistical correlation of a simulation run with a failure condition. The Source selections can be used to view the source for the verification plan or coverage item (e.g., e for "e" and v for Verilog). Buckets, Holes and Project can be used for analysis features (e.g, looking for missing holes). Coverage can be used to launch an external coverage analysis tool.

Below the selection buttons, this view consists of three main windows, and a series of buttons to perform additional analysis tasks. The three main windows are the "vplan" (for verification plan) 1008, the item detail 1010, and item source windows 1012. The vplan window 1008 in this case is showing the summary of the results collected by the invention. It shows the summary coverage of the power modes, mode transitions, and the power domain control signals. In this case we can see that we have 100% coverage on most items, but only 80% coverage on the power mode transition.

FIG. 11 shows the detailed analysis of the power mode transition coverage. This analysis is called "bucket analysis" and it shows the exact set of transitions that did occur, and the number of times each transition occurred. In this case, we can see that four of the transitions each happened seven times. But one transition, from PM4 to PM1 never occurred during the simulation runs that were monitored. The 80% grade is calculated based on four out of five defined transitions being exercised.

Figure 12:
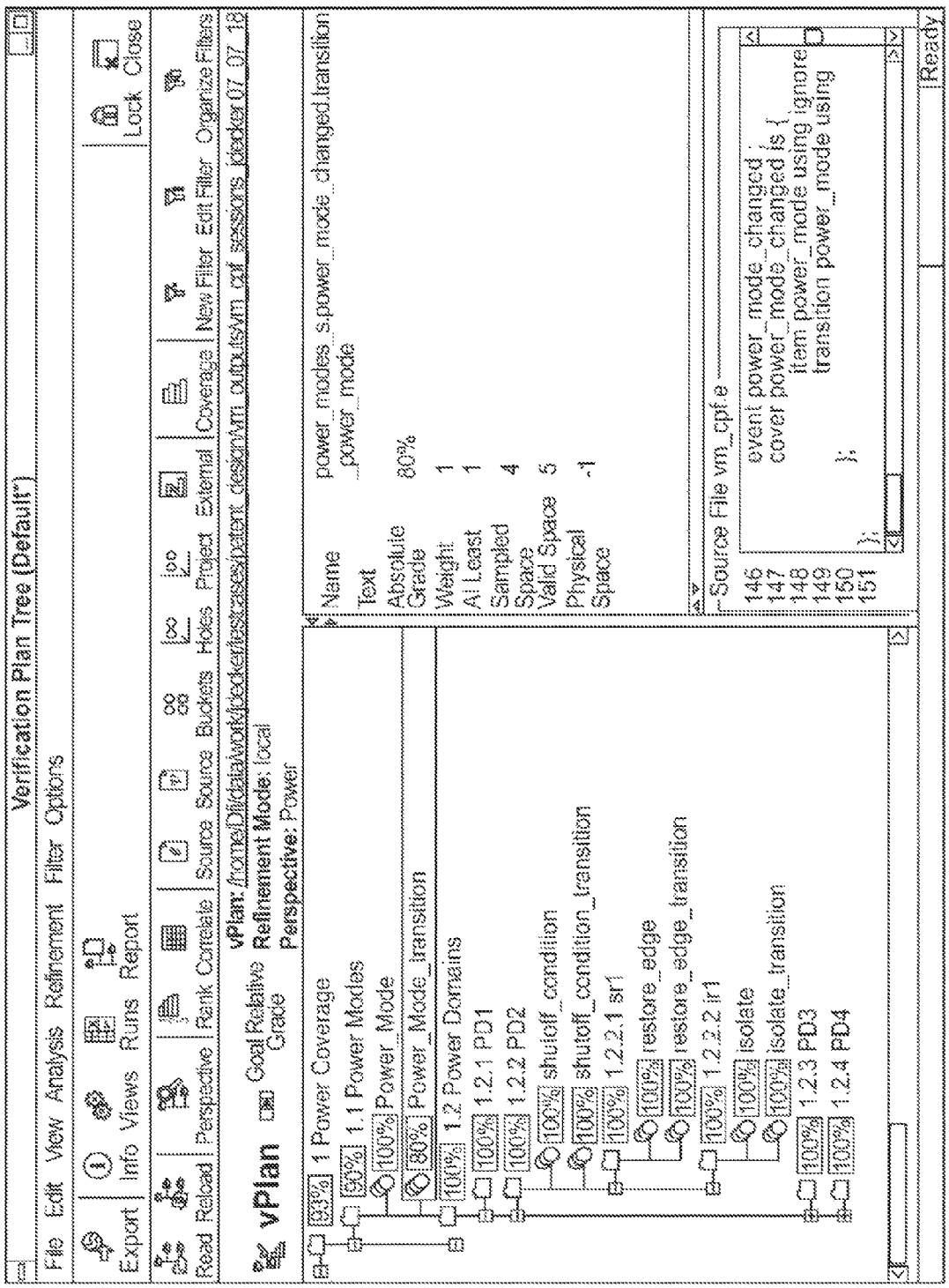
FIG. 12 shows show exemplary GUI representation for evaluating the coverage items post-simulation in the embodiment of FIG. 1.

FIG. 12 shows a more detailed analysis of the power domain coverage collection. For each power domain, the coverage is shown for its shutoff_expression, and for all isolation, save and restore conditions that relate to this power domain. During the debug of a power aware design, it is important to make sure all of the power control signals have been exercised. If missing items would indicate incomplete testing or an error in the power control in the design.

FIG. 13 shows a detailed analysis of the power mode profile for the set of simulation runs. This is an example of the metrics and data automatically collected by the interface. The simulation time of each test case is calculated, and the break down of how much time is spent in each power mode is displayed. This information is valuable in several ways: First, to compute a true power estimate for the design, the user needs to know the time spent in each mode (provided by the invention), and the power consumed by that mode. Second, if any particular power mode has little simulation time, it indicates that either the testing is incomplete or that the system is unable to utilize that power mode. The user would then want to either update their tests, modify the control of when a power mode is entered, or potentially just remove this power mode as it does not help reduce power.

Figure 15:
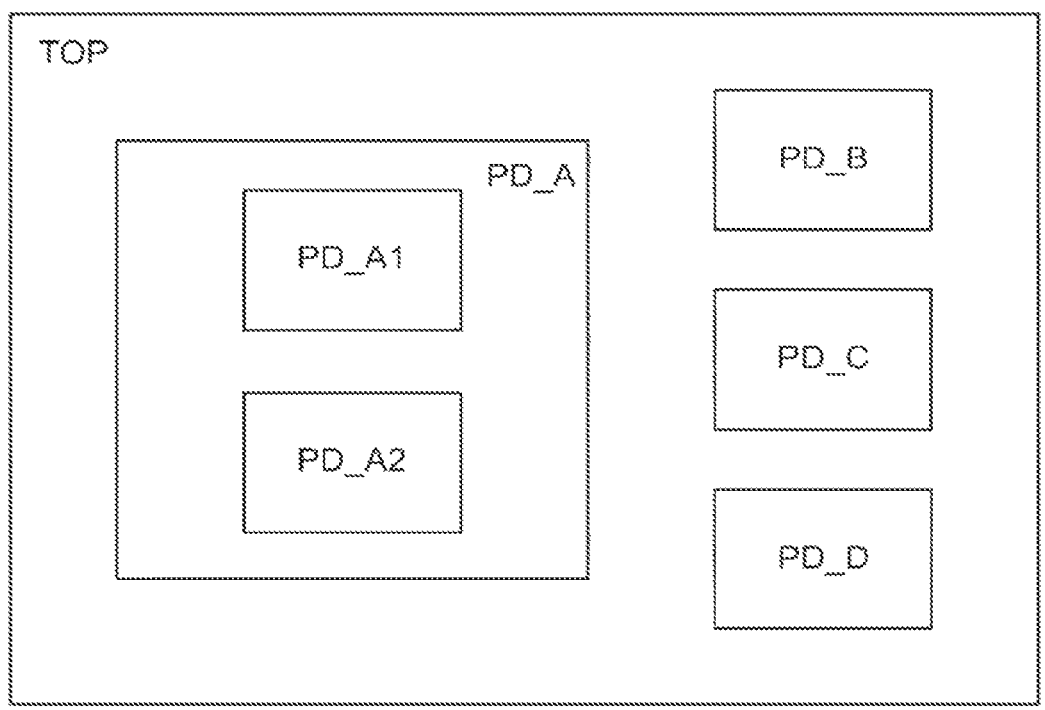
FIG. 15 shows an embodiment related to the embodiment of FIG. 1 where the power domains are hierarchical.

Additional embodiments relate to generalizations of power domains and power modes as illustrated in FIGS. 14-15.

FIG. 14 shows an embodiment where the power domains can take on more than two voltage values (e.g., on/off). As shown in FIG. 14, the two power domains can take voltage values characterized as "low", "high" and "off." Clearly this approach can be generalized to any number of voltage states that need not be uniform across the power domains. For example, the voltage definitions of "low" can be different in the two power domains illustrated.

FIG. 15 shows an embodiment where power domains may be hierarchical so that a power mode for a given domain implies a specification of distinct power levels (e.g., voltages) in sub-domains. For example, in FIG. 15 the top domain includes power domains PD_A, PD_B, PD_C, and PD_D, and PD_A includes a first sub-domain PD_A1 and a second sub-domain PD_A2. A power mode value of for PD_A (e.g., high) then implies distinct power modes for the two sub-domains (e.g., PD_A1 high and PD A2 low). Note that the words "first" and "second" are used here and elsewhere for labeling purposes only and are not intended to denote any specific spatial or temporal ordering. Furthermore, the labeling of a "first" element does not imply the presence a "second" element.

At least some values for the results of the method 102 can be output to a user or saved for subsequent use. For example the coverage item values can be saved directly for application as in power design. Alternatively, some derivative or summary form of the results (e.g., averages, interpolations, etc.) can be saved for later use according to the requirements of the operational setting.

Figure 16:
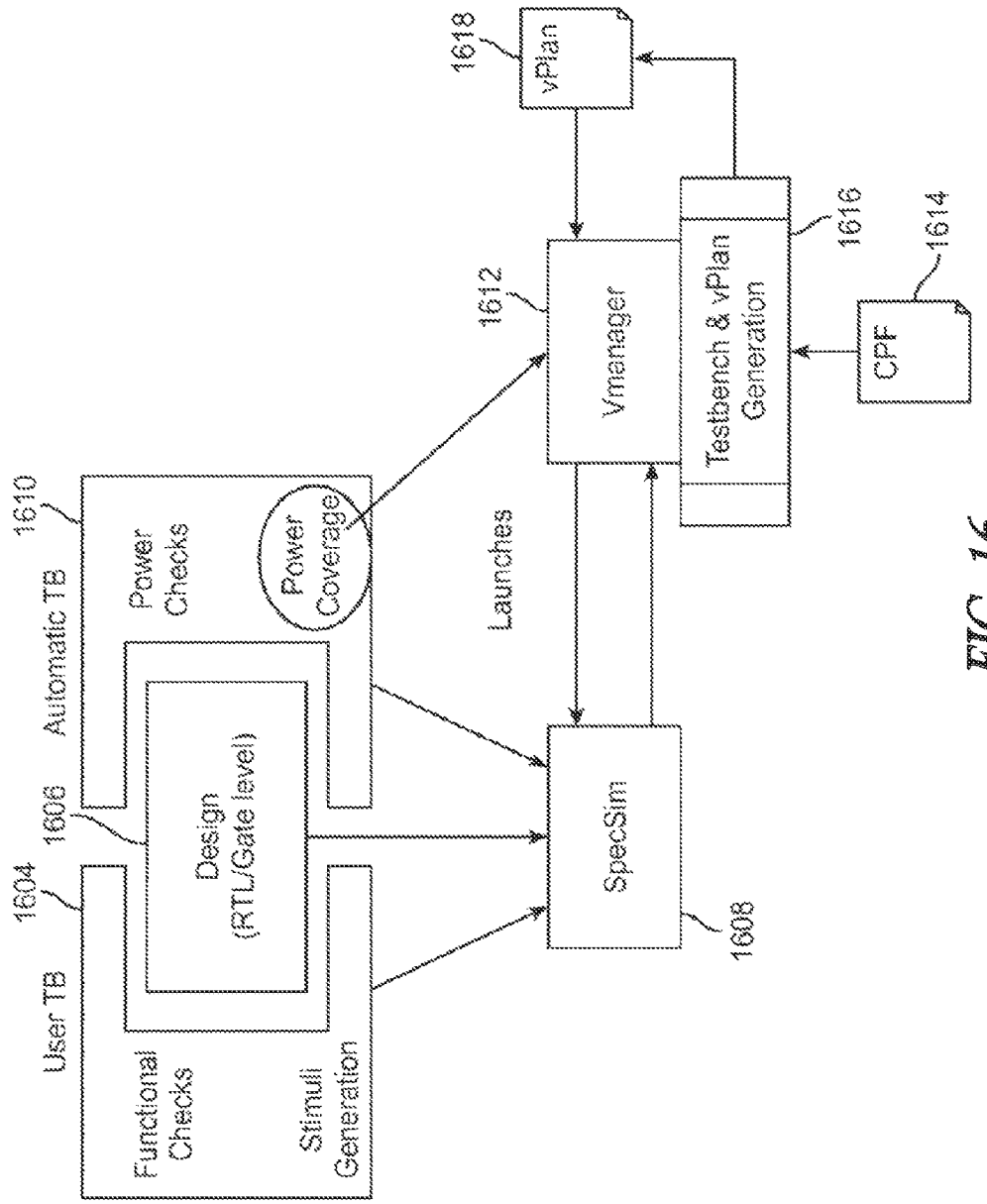
FIG. 16 shows an embodiment that includes a conventional user testbed for carrying out functional tests on an IC design.

In some operational settings, embodiments can be considered as modifications or enhancements of existing simulation infrastructure. FIG. 16 shows a system 1602 that includes a user testbench 1604 that wraps around an IC design (e.g., interfaces inputs and outputs for design at the RTL/gate level) 1606 and also interfaces with a simulator ("SpecSim") 1608. This type of simulation testbed 1604 is conventional for carrying out functional tests on a design 1606 by generating stimuli that are passed to the simulator 1608 whose results are analyzed by an output checker that produces an error report if the design implementation does not meet the design specification.

This simulation environment can be enhanced by an automatic testbed 1610 that carries out evaluations for power (and power coverage) as described above based on the specified power architecture. In this embodiment the automatic testbed 1610 also wraps around the IC design 1606 and interfaces with a verification manager 1612 that connects to the simulator 1608 and launches simulations for power verification. Similarly as described above, the power architecture can be expressed as a CPF file 1614 that is used to generate 1616 a testbench file that specifies the coverage items for the automatic testbench 1610 and a verification plan 1618 that is used by the verification manager 1612 to evaluate the simulation results (e.g., as a generalization of a conventional output checker).

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., keyboard, display, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof. At least some values for the results of the method can be saved, either in memory (e.g., RAM (Random Access Memory)) or permanent storage (e.g., a hard-disk system) for later use Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

The following tables include exemplary code for illustrating embodiments of the present invention as described above. Table A contains CPF code that specifies a power architecture Table B contains simulation code related to monitoring a control signal (e.g., cell isolation). Table C contains exemplary verification plan code related to a control signal.

TABLE A

Exemplary CPF file

```
1   # Define top design
    #------------------
    set_design top
    # Set up logic structure for all power domains
5   #------------------------------------------
    create_power_domain -name PD1 -default
    create_power_domain -name PD2 -instances {inst_A inst_B}
      -shutoff_condition {pm_inst.pse_enable[0]}
    create_power_domain -name PD3 -instances inst_C \
10    -shutoff_condition {pm_inst.pse_enable[1]}
    create_power_domain -name PD4 -instances inst_D \
      -shutoff_condition {pm_inst.pse_enable[2]}
        #
        #-------------------------------------------------------------
-----
```

TABLE A-continued

Exemplary CPF file

```
15  create_nominal_condition -name high -voltage 1.2
    create_nominal_condition -name medium -voltage 1.1
    create_nominal_condition -name low -voltage 1.0
    create_power_mode -name PM1 -domain_conditions
      {PD1@high PD2@medium PD3@high PD4@low}
20  create_power_mode -name PM2 -domain_conditions
    {PD1@high PD3@high PD4@low}
    create_power_mode -name PM3 -domain_conditions
      {PD1@high PD4@low}
    create_power_mode -name PM4 -domain_conditions {PD1@low}
25  create_mode_transition -name tr_1_2 -from_mode PM1
      -to_mode PM2 -start_condition start
    create_mode_transition -name tr_2_3 -from_mode PM2
      -to_mode PM2 -start_condition start2
    create_mode_transition -name tr_3_4 -from_mode PM3
30    -to_mode PM4 -30   start_condition start3
    create_mode_transition -name tr_4_1 -from_mode PM4
      -to_mode PM1 -start_condition start4
    create_mode_transition -name tr_4_3 -from_mode PM4 -to_mode
      PM3 - start_condition start5
35
    # Set up required isolation and state retention rules for all
domains
    #---------------------------------------------------------------
--
    create_state_retention_rule -name sr1 -domain PD2 \
40    -restore_edge {!pm_inst.pge_enable[0]}
    create_state_retention_rule -name sr2 -domain PD3 \
      -restore_edge {!pm_inst.pge_enable[1]}
    create_state_retention_rule -name sr3 -domain PD4 \
      -restore_edge {!pm_inst.pge_enable[2]}
45  create_isolation_rule -name ir1 -from PD2 \
      -isolation_condition {pm_inst.ice_enable[0]} -isolation_output
high
    create_isolation_rule -name ir2 -from PD3 \
      -isolation_condition {pm_inst.ice_enable[1]}
    create_isolation_rule -name ir3 -from PD4 \
50    -isolation_condition {pm_inst.ice_enable[2]}
    create_level_shifter_rule -name lsr1 -to {PD1 PD3}
    end_design
```

TABLE B

Exemplary Simulation Code for Monitoring a Control Signal

```
struct control_condition {
    !control_condition : control_conditions_t ;
    !enable : bool ;
    update_info( ) is {
        var enable_prev_val : bool = enable ;
        enable = evaluate_control_condition( ) ;
        if (enable != enable_prev_val) {
            emit condition_changed ;
        };
    };
    evaluate_control_condition( ) : bool is empty ;
    //define coverage
    event condition_changed ;
    cover condition_changed is {
        item control_condition using per_instance ;
        item enable ;
        transition enable using ignore = (prev_enable ==
enable);
    };
};
extend PD2_isolation logic_ir1_isolate {
    evaluate_control_condition( ) : bool is {
        result = $ice_enable[0]_;
    };
};
```

TABLE C

Exemplary Verification Plan Code for Control Signal

```
section PD2 {
            details : <text>Name: PD2<br>Instances </text>;
    section ir1 {
        details: <text> Isolation rule ir1</text>;
        coverage isolate {
        items_pattern :
            control_condition.condition_changed
(control_condition==PD2_isolation_logic_ir1_isolate).enable
        }
    }
}
```

What is claimed is:

1. A method for modeling power management in an integrated circuit (IC), comprising:
specifying a circuit design and a power architecture for the IC, the power architecture including a plurality of power domains for specifying power levels in different portions of the IC, wherein the power architecture includes at least one control signal for each power domain, the at least one control signal including a signal for enabling a power switch, enabling an isolation cell, or enabling a state retention;
determining a testbench for simulating the IC and a verification plan for evaluating simulation results;
using a computer for simulating the IC and using the testbench to monitor variations in power levels of the power domains of the IC in the simulation, wherein using the testbench includes counting instances of control signals for power domains in the simulation; and
using the verification plan to evaluate the simulation results for the power domains of the IC.

2. A method according to claim 1, wherein
the power architecture includes a plurality of power modes that specify power levels in the power domains, and
using the testbench includes counting instances of power modes and power-mode transitions in the simulation.

3. A method according to claim 1, wherein
the power architecture includes a plurality of power modes that specify power levels in the power domains, and
simulating the IC includes generating simulation inputs for a range of power levels that are specified by the power architecture.

4. A method according to claim 1, wherein
determining the testbench includes determining a plurality of coverage items for monitoring states of the power domains,
using the testbench includes counting instances of the coverage items in the simulation, and
using the verification plan includes verifying a coverage criterion for completeness for one or more of the coverage items in the simulation.

5. A method according to claim 1, wherein
determining the testbench includes determining a plurality of coverage items for monitoring states of power-related control signals of the power domains,
using the testbench includes counting instances of the coverage items in the simulation, and
using the verification plan includes verifying a coverage criterion for completeness for one or more of the coverage items in the simulation.

6. A method according to claim 1, wherein
determining the testbench includes determining a plurality of attributes for grouping common features of power-related failures, wherein the attributes include states of power domains at power-related failures, and
using the testbench includes counting instances of the attributes in the simulation.

7. A method according to claim 1, wherein
determining the verification plan includes determining a template for evaluating at least one coverage criterion for completeness of the simulation results across the power domains, and
using the verification plan includes evaluating the at least one coverage criterion for a range of power levels in the simulation results.

8. A method according to claim 1, wherein using the testbench includes counting instances of power-domain events for monitoring variations in power levels of the power domains in the simulation.

9. A method according to claim 1, wherein using the verification plan includes providing a graphical user interface (GUI) that shows coverage levels for power levels of the power domains in the simulation results.

10. An apparatus for modeling power management in an integrated circuit (IC), the apparatus comprising a computer for executing computer instructions, wherein the computer includes computer instructions for:
specifying a circuit design and a power architecture for the IC, the power architecture including a plurality of power domains for specifying power levels in different portions of the IC, wherein the power architecture includes at least one control signal for each power domain, the at least one control signal including a signal for enabling a power switch, enabling an isolation cell, or enabling a state retention;
determining a testbench for simulating the IC and a verification plan for evaluating simulation results;
simulating the IC and using the testbench to monitor variations in power levels of the power domains of the IC in the simulation, wherein using the testbench includes counting instances of control signals for power domains in the simulation; and
using the verification plan to evaluate the simulation results for the power domains of the IC.

11. An apparatus according to claim 10, wherein
the power architecture includes a plurality of power modes that specify power levels in the power domains, and
using the testbench includes counting instances of power modes and power-mode transitions in the simulation.

12. An apparatus according to claim 10, wherein
the power architecture includes a plurality of power modes that specify power levels in the power domains, and
simulating the IC includes generating simulation inputs for a range of power levels that are specified by the power architecture.

13. An apparatus according to claim 10, wherein determining the testbench includes determining a plurality of coverage items for monitoring states of the power domains,
using the testbench includes counting instances of the coverage items in the simulation, and
using the verification plan includes verifying a coverage criterion for completeness for one or more of the coverage items in the simulation.

14. An apparatus according to claim 10, wherein determining the testbench includes determining a plurality of coverage items for monitoring states of power-related control signals of the power domains, using the testbench includes counting instances of the coverage items in the simulation, and using the verification plan includes verifying a coverage criterion for completeness for one or more of the coverage items in the simulation.

15. An apparatus according to claim 10, wherein determining the testbench includes determining a plurality of attributes for grouping common features of power-related failures, wherein the attributes include states of power domains at power-related failures, and using the testbench includes counting instances of the attributes in the simulation.

16. An apparatus according to claim 10, wherein determining the verification plan includes determining a template for evaluating at least one coverage criterion for completeness of the simulation results across the power domains, and using the verification plan includes evaluating the at least one coverage criterion for a range of power levels in the simulation results.

17. An apparatus according to claim 10, wherein using the testbench includes counting instances of power-domain events for monitoring variations in power levels of the power domains in the simulation.

18. An apparatus according to claim 10, wherein using the verification plan includes providing a graphical user interface (GUI) that shows coverage levels for power levels of the power domains in the simulation results.

19. An apparatus according to claim 10, wherein the computer includes a processor with memory for executing at least some of the computer instructions.

20. An apparatus according to claim 10, wherein the computer includes circuitry for executing at least some of the computer instructions.

21. A computer-readable medium that stores an executable computer program for modeling power management in an integrated circuit (IC), wherein the computer program includes instructions for:

specifying a circuit design and a power architecture for the IC, the power architecture including a plurality of power domains for specifying power levels in different portions of the IC, wherein the power architecture includes at least one control signal for each power domain, the at least one control signal including a signal for enabling a power switch, enabling an isolation cell, or enabling a state retention;

determining a testbench for simulating the IC and a verification plan for evaluating simulation results;

simulating the IC and using the testbench to monitor variations in power levels of the power domains of the IC in the simulation, wherein using the testbench includes counting instances of control signals for power domains in the simulation; and using the verification plan to evaluate the simulation results for the power domains of the IC.

22. A computer-readable medium according to claim 21, wherein the power architecture includes a plurality of power modes that specify power levels in the power domains, and using the testbench includes counting instances of power modes and power-mode transitions in the simulation.

23. A computer-readable medium according to claim 21, wherein determining the testbench includes determining a plurality of coverage items for monitoring states of the power domains, using the testbench includes counting instances of the coverage items in the simulation, and using the verification plan includes verifying a coverage criterion for completeness for one or more of the coverage items in the simulation.

24. A computer-readable medium according to claim 21, wherein determining the testbench includes determining a plurality of coverage items for monitoring states of power-related control signals of the power domains, using the testbench includes counting instances of the coverage items in the simulation, and using the verification plan includes verifying a coverage criterion for completeness for one or more of the coverage items in the simulation.

25. A computer-readable medium according to claim 21, wherein using the testbench includes counting instances of power-domain events for monitoring variations in power levels of the power domains in the simulation.

* * * * *

UNITED STATES PATENT AND TRADEMARK OFFICE
CERTIFICATE OF CORRECTION

| | |
|---|---|
| PATENT NO. | : 7,770,142 B1 |
| APPLICATION NO. | : 11/929517 |
| DATED | : August 3, 2010 |
| INVENTOR(S) | : Arik Shmayovitsh et al. |

It is certified that error appears in the above-identified patent and that said Letters Patent is hereby corrected as shown below:

In Sheet 6 of 16 (Under Description), Fig. 6, line 18, delete "initiatiated" and insert -- initiated --, therefor.

In Column 3, line 35, after "FIG. 1" insert -- . --

In Column 6, line 11, delete "-domain conditions" and insert -- domain_conditions --, therefor.

In Column 6, line 46, delete "irl" and insert -- ir1 --, therefor.

In Column 6, line 61, delete "irl" and insert -- ir1 --, therefor.

In Column 6, line 63, delete "irl" and insert -- ir1 --, therefor.

In Column 10, line 39, delete "PD A2" and insert -- PD_A2 --, therefor.

In Column 11, line 26, after "use" insert -- . --.

Signed and Sealed this
Twenty-fifth Day of January, 2011

David J. Kappos
*Director of the United States Patent and Trademark Office*